United States Patent
Boivin et al.

(10) Patent No.: US 9,793,321 B2
(45) Date of Patent: Oct. 17, 2017

(54) RESISTIVE MEMORY CELL HAVING A COMPACT STRUCTURE

(71) Applicants: STMicroelectronics (Crolles 2) SAS, Crolles (FR); STMicroelectronics (Rousset) SAS, Rousset (FR)

(72) Inventors: Philippe Boivin, Venelles (FR); Simon Jeannot, Grenoble (FR)

(73) Assignees: STMicroelectronics (Crolles 2) SAS, Crolles (FR); STMicrolectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/970,347

(22) Filed: Dec. 15, 2015

(65) Prior Publication Data

US 2016/0380030 A1   Dec. 29, 2016

(30) Foreign Application Priority Data

Jun. 23, 2015 (FR) ...................... 1555732

(51) Int. Cl.
*H01L 45/00* (2006.01)
*H01L 27/24* (2006.01)
*G11C 13/00* (2006.01)

(52) U.S. Cl.
CPC ...... *H01L 27/2436* (2013.01); *H01L 27/2463* (2013.01); *H01L 45/04* (2013.01);
(Continued)

(58) Field of Classification Search
CPC ............. H01L 27/2436; H01L 45/1608; H01L 45/1683
See application file for complete search history.

(56) References Cited

U.S. PATENT DOCUMENTS 8,471,233 B2 * 6/2013 Aozasa ................ H01L 27/101
257/2
8,698,118 B2    4/2014 Toh et al.
(Continued)

FOREIGN PATENT DOCUMENTS

EP   1 845 567 A1   10/2007
JP   09082912 A  *  3/1997

OTHER PUBLICATIONS

English Translation of JP H09-082912 A Provided by AIPN, Published Mar. 28, 1997.*
(Continued)

*Primary Examiner* — Stephen Bradley
(74) *Attorney, Agent, or Firm* — Seed IP Law Group LLP

(57) ABSTRACT

The disclosure relates to a memory cell formed in a wafer comprising a semiconductor substrate covered with a first insulating layer, the insulating layer being covered with an active layer made of a semiconductor, the memory cell comprising a selection transistor having a control gate and a first conduction terminal connected to a variable-resistance element, the gate being formed on the active layer and having a lateral flank covered with a second insulating layer, the variable-resistance element being formed by a layer of variable-resistance material, deposited on a lateral flank of the active layer in a first trench formed through the active layer along the lateral flank of the gate, a trench conductor being formed in the first trench against a lateral flank of the layer of variable-resistance material.

18 Claims, 5 Drawing Sheets

(52) U.S. Cl.
CPC ........ *H01L 45/085* (2013.01); *H01L 45/1226* (2013.01); *H01L 45/1666* (2013.01); *G11C 13/0004* (2013.01); *G11C 2213/79* (2013.01); *G11C 2213/82* (2013.01); *H01L 45/146* (2013.01); *H01L 45/147* (2013.01)

(56) References Cited

U.S. PATENT DOCUMENTS

| | | |
|---|---|---|
| 2010/0032641 A1 | 2/2010 | Mikawa et al. |
| 2012/0243307 A1 | 9/2012 | Takashima |
| 2015/0144862 A1 | 5/2015 | Choi et al. |

OTHER PUBLICATIONS

Deng, F. et al., "Salicidation process using NiSi and its device application," J. Appl. Phys. 81(12):8047-8051, Jun. 15, 1997.

Gambino, J.P. et al., "Silicides and ohmic contacts," Materials Chemistry and Physics, vol. 52, pp. 99-146, 1998.

\* cited by examiner

RESISTIVE MEMORY CELL HAVING A COMPACT STRUCTURE

BACKGROUND

Technical Field

The present disclosure relates to resistive memories, and more generally memories in which each memory cell comprises a selection gate and a variable-impedance element able to exhibit a number of different states detectable by an impedance measurement. Depending on whether the element preserves its state when its supply of electric power is turned off, the memory is either volatile or nonvolatile.

Description of the Related Art

Thus, a number of types of resistive memories are being developed. In CBRAMs (conductive-bridging random access memories), the variable-impedance element comprises two electrodes and a thin layer of solid electrolyte placed between the electrodes. Under the effect of biasing of the element, metal ions migrate from one of the two electrodes and from the electrolyte towards the other electrode, and form one or more filaments that decrease the electrical resistance of the element.

RRAM or ReRAM (resistive RAM) memories comprise a dielectric element that may be made to conduct reversibly by forming conductive filaments obtained by applying a sufficiently high voltage. In particular, OxRAM memories use metal oxides (Ox) as the material of the resistance which may be controlled reversibly.

In FeRAM or FRAM (ferroelectric RAM) memories, the variable-resistance element comprises a capacitor the dielectric of which is a ferroelectric material in which magnetic dipoles may be oriented along field lines of an electric field formed between the electrodes when the capacitor is charged. When the capacitor discharges, the dipoles preserve their orientation.

The variable-resistance element of magnetoresistive RAM (MRAM) memories comprises two plates made of ferromagnetic material able to produce an electric field, separated by a dielectric film. One of the plates is a permanent magnet, whereas the other plate generates a magnetic field that may be modified by an electric current. The state of the memory cell is read via a resistance measurement.

FIGS. 1A and 1B schematically show in cross section a semiconductor substrate SUB on which has been formed a memory cell MC comprising a variable-resistance element VZ. FIG. 1A is a longitudinal view in cross section along the plane AA' indicated in FIG. 1B, and FIG. 1B is a transverse view in cross section along the plane BB' indicated in FIG. 1A. The memory cell MC comprises a selection transistor comprising a gate GT, drain DDP and source SDP regions on either side of the gate GT, and a channel region under the gate GT between the drain DDP and source SDP regions. The gate GT is produced in a layer made of polysilicon formed on an insulating layer GO deposited on the substrate SUB. The regions DDP, SDP are formed by implanting dopants into the substrate SUB on each side of the gate GT. The memory cell MC is covered with a dielectric insulator D1. The source region SDP is connected to a source line SL by way of a via passing through the insulating layer D1. The gate GT forms a word line WL lying parallel to the source line SL. The variable-resistance element VZ is formed in the insulating layer D1 and is connected to the drain region DDP by way of a via formed in the insulating layer D1. The variable-resistance element VZ is connected to a bit line BL formed on the surface of the insulating layer D1, by way of a via BC formed in the insulating layer D1. The bit line BL runs perpendicular to the word line WL and source line SL.

The memory cell is isolated from adjacent memory cells (or other circuit elements formed on the substrate SUB) by shallow trench isolations STI1 parallel to the gate GT, and shallow trench isolations STE perpendicular to the gate GT. The trench isolations STI1 may be replaced by transistor gates (such as the gate GT) biased so as to maintain the associated transistor in the off state.

FIG. 2 shows the electric circuit of one portion of a memory plane comprising memory cells such as the memory cell MC shown in FIGS. 1A and 1B. The memory plane comprises word lines WL, source lines SL parallel to the word lines WL and bit lines perpendicular to the word lines WL and to the source lines SL. Each memory cell MC comprises a selection transistor ST comprising a (source or drain) conduction terminal connected to one terminal of a variable-resistance element VZ, the other terminal of which is connected to one of the bit lines BL. The other conduction terminal of the selection transistor ST is connected to one of the source lines SL, and the gate terminal of the transistor ST is connected to one of the word lines WL.

To decrease the area occupied by each memory cell, it has been proposed to produce the memory cells in pairs sharing a single conduction region connected to one source lines, as in FIG. 2. In this embodiment, the trench isolation STI1 to the left in FIG. 1A is replaced by a gate, such as the gate GT, forming the gate of the selection transistor of the other memory cell of the pair of memory cells.

It would be desirable to further decrease the substrate area occupied by a memory cell comprising a variable-resistance element.

BRIEF SUMMARY

Embodiments relate to a memory cell comprising a selection transistor having a control gate and a first conduction terminal connected to a variable-resistance element, the memory cell being formed in a wafer comprising a semiconductor substrate covered with a first insulating layer, the insulating layer being covered with an active layer made of a semiconductor, the gate being formed on the active layer and having a lateral flank covered with a second insulating layer, the variable-resistance element being formed by a layer of variable-resistance material, deposited on a lateral flank of the active layer in a first trench formed through the active layer along the lateral flank of the gate and reaching the first insulating layer, a trench conductor being formed in the first trench against a lateral flank of the layer of variable-resistance material.

According to one embodiment, the trench conductor is formed between two adjacent trench isolations that it reaches, the two trench isolations and the trench conductor bounding between them the memory cell.

According to one embodiment, the trench conductor passes through the two adjacent trench isolations, bounding the memory cell.

According to one embodiment, the layer of variable-resistance material covers a portion of the bottom of the first trench, the trench conductor being formed in a second trench formed through the layer of variable-resistance material.

According to one embodiment, the substrate, the active layer and the first insulating layer together form an FDSOI substrate.

Embodiments may also relate to a memory comprising at least two memory cells such as described above, the control gate of each memory cell being connected to a word line of the memory, the variable-resistance element of each memory cell being connected to a bit line of the memory, and the selection transistor of each memory cell comprising a second conduction terminal connected to a source line of the memory.

According to one embodiment, the variable-resistance elements of the two memory cells are formed in the first trench and are separated from each other by the trench conductor, which is connected to a given bit line.

According to one embodiment, the trench conductor makes direct contact with other variable-resistance elements of other memory cells of the memory, and forms the bit line.

According to one embodiment, the second conduction terminal of each memory cell is shared with another memory cell of the memory.

Embodiments may also relate to a process for fabricating an integrated circuit comprising a memory cell, the process comprising steps consisting in: forming a selection transistor on a semiconductor substrate covered with a first insulating layer, the insulating layer being covered with an active layer made of a semiconductor, the selection transistor comprising a control gate and first and second conduction terminals; covering with a second insulating layer a lateral flank of the control gate on the same side as the first conduction terminal; producing a trench through the active layer in the first conduction terminal, reaching the first insulating layer; depositing a layer of a variable-resistance material in the first trench, covering a lateral flank of the active layer in the first trench; and forming in the layer of variable-resistance material a trench conductor reaching the first insulating layer.

According to one embodiment, the trench conductor is produced by etching a second trench into the layer of variable-resistance material through a mask, and by filling the second trench with a conductor.

According to one embodiment, the trench conductor is formed by applying an anisotropic etch to the layer of variable-resistance material, until the first insulating layer at the bottom of the first trench is reached, and by filling the first trench with a conductor.

According to one embodiment, the trench conductor is formed so as to separate the layer of variable-resistance material at the bottom of the first trench into two portions respectively forming two variable-resistance elements of two memory cells sharing the trench conductor to connect the two memory cells to a bit line.

BRIEF DESCRIPTION OF THE SEVERAL VIEWS OF THE DRAWINGS

Non-limiting exemplary embodiments of the disclosure will be described below with reference to the appended figures, in which.

DETAILED DESCRIPTION

Figure 3A:
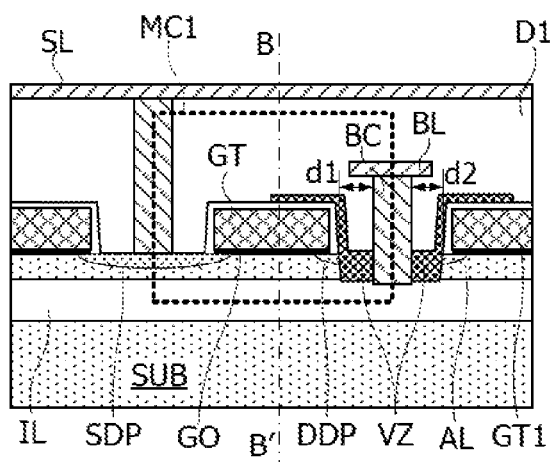
FIGS. 3A, 3B and 3C schematically show a semiconductor substrate in which are formed memory cells comprising a variable-resistance element according to one embodiment, in transverse cross section, in longitudinal cross section and from above, respectively.
Figure 3B:
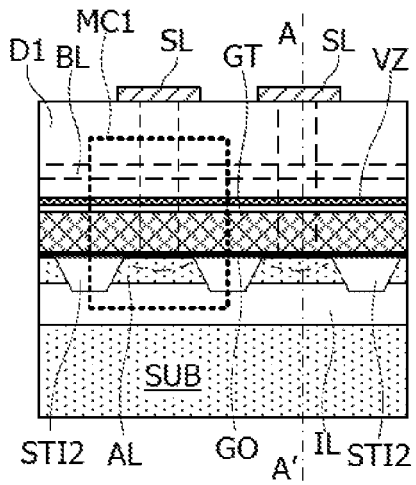
Figure 3C:
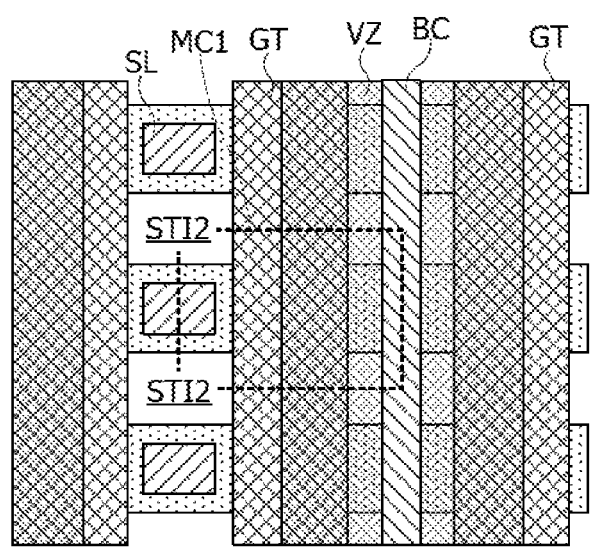

FIGS. 3A, 3B and 3C schematically show a semiconductor substrate SUB on which has been formed a memory cell MC1, comprising a variable-resistance element VZ, according to one embodiment. FIG. 3A is a view in cross section along the plane AA' indicated in FIG. 3B, and FIG. 3B is a view in cross section along the plane BB' indicated in FIG. 3A. The substrate SUB is a silicon-on-insulator (SOI) substrate and comprises an insulating layer IL formed on one side of the substrate SUB and an active layer AL made of a semiconductor, for example silicon, formed on the insulating layer IL. The substrate SUB may be a fully depleted SOI (FDSOI) substrate.

The memory cell MC1 contains a selection transistor comprising a gate GT formed on the substrate SUB, and conduction regions SDP and DDP formed on the two sides of the gate GT, respectively. The gate GT is made of a conductor such as doped polysilicon, on an insulating layer GO, for example of the oxide $SiO_2$, deposited on the active layer AL. The gate GT forms a channel region between the regions DDP and SDP. The regions SDP and DDP are produced by implanting dopants into the active layer AL. The region SDP thus forms a conduction region common to the selection transistors of the memory cell MC and of an adjacent memory cell. A via is formed on the region SDP to connect the latter to a source line SL The gate GT, and in particular the lateral flanks of the gate, are covered with a dielectric layer SP forming a spacer. The memory cell MC1 is covered with a dielectric insulator D1 that may also be the oxide $SiO_2$ or a metal oxide. In FIGS. 3B and 3C, adjacent memory cells are isolated from each other by adjacent trench isolations STI2 formed in the active layer AL and reaching the insulating layer IL.

According to one embodiment, a first trench is produced between the spacers SP of the gate GT and an adjacent gate GT1, through the active layer AL in the region DDP, until the insulating layer IL is reached. A layer made of a variable-resistance material is deposited and etched so as to partially cover an insulating layer deposited on the gates GT, GT1, the spacers SP and the substrate region between the spacers SP of the gates GT, GT1, and in particular the lateral flanks of the active layer AL in the first trench. A second trench is formed in the center of the first trench in the layer of variable-resistance material. The second trench thus forms two variable-resistance elements VZ. The second trench is filled with a conductor so as to form a trench conductor BC between the memory cells. The trench conductor BC thus forms a bit line BL. In this way, the layer made of variable-resistance material forms a variable-resistance element VZ both for the memory cell MC1 and the adjacent memory cell comprising the gate GT1.

The variable-resistance layer VZ may be a solid electrolyte or a dielectric material capable of forming filaments under the effect of a voltage applied between the electrodes, or indeed a ferromagnetic material, or even a material able to exhibit amorphous and crystalline phases. The variable-resistance layer VZ may be made of a metal oxide such as copper oxide (CuO), silicon oxide ($SiO_2$), hafnium oxide ($HfO_2$), nickel oxide (NiO) zinc oxide (ZnO) aluminum oxide or alumina ($Al_2O_3$), vanadium oxide ($VO_2$) or even the oxide strontium titanate ($SrTiO_3$).

Figure 1A:
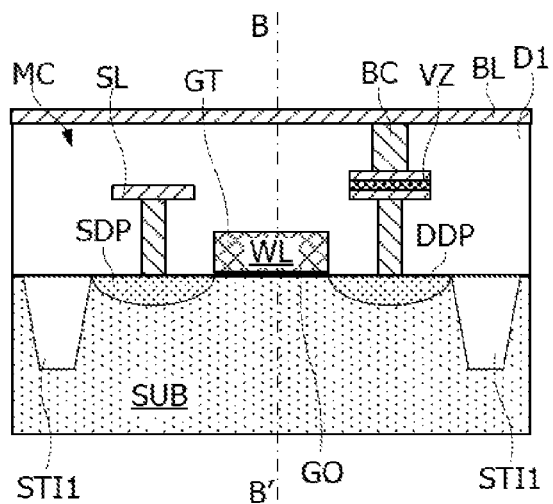
FIGS. 1A and 1B, described above, schematically show transverse and longitudinal cross-sectional views of a semiconductor substrate in which has been formed a conventional memory cell comprising a variable-resistance element.
Figure 1B:
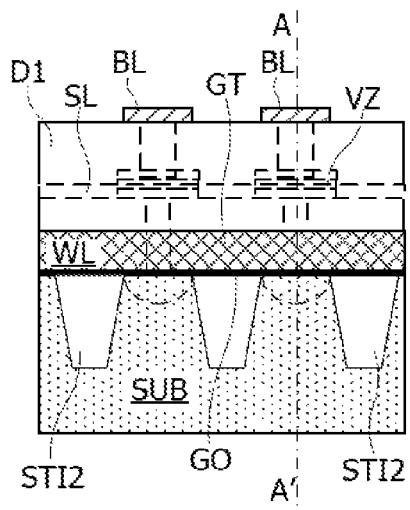
Figure 2:
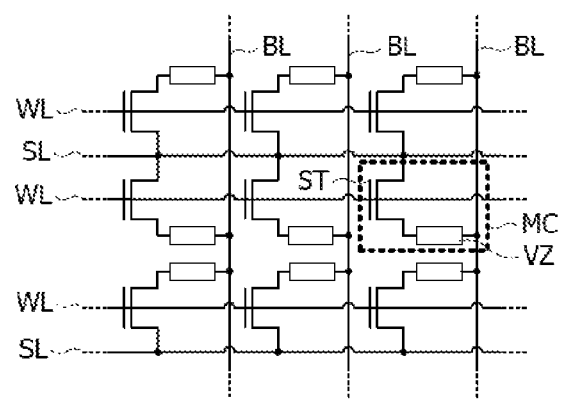
FIG. 2, described above, schematically shows the electric circuit of a memory plane comprising memory cells each containing a variable-resistance element, such as that in FIGS. 1A and 1B.

The memory cell structure described above allows a relatively substantial saving in substrate area to be obtained by virtue of the fact that the spaces between the gates GT, GT1 are shared by two adjacent memory cells. Relative to the structure shown in FIGS. 1A and 1B, the memory cell structure shown in FIGS. 3A to 3C allows the length of substrate occupied by a memory cell to be decreased by about 29% while preserving the dimensions of the constituent elements of the memory cells.

Figure 4:
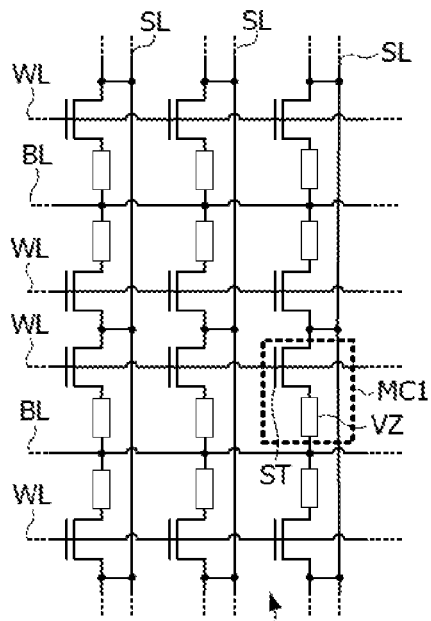
FIG. 4 schematically shows the electric circuit of a memory plane comprising memory cells each containing a variable-resistance element, such as that in FIG. 3A.

FIG. 4 is a circuit diagram of a memory plane MA1 comprising a plurality of memory cells, such as the memory cell MC1. The memory plane comprises bit lines BL, word lines WL parallel to the bit lines BL and source lines SL perpendicular to the bit lines BL and to the word lines WL. Each memory cell MC1 comprises a selection transistor ST, and a variable-resistance element VZ such as that shown in FIGS. 3A and 3B. The transistor ST comprises a (source or drain) conduction terminal connected to one terminal of the variable-resistance element VZ, the other terminal of which is connected to one of the bit lines BL. The other (drain or source) conduction terminal of the selection transistor ST is connected to one of the source lines SL. The transistor ST comprises a gate terminal connected to one of the word lines WL. The resistance of the element VZ may be changed between a highly resistant state and a lowly resistant state by applying thereto a voltage higher than a threshold voltage (unipolar memories) or an inverted voltage (bipolar memories).

It will be noted that the conduction regions DDP, SDP of the selection transistor ST may irrespectively form a drain terminal and a source terminal of the transistor, and that the functions of the bit line BL and source line BL may be inverted.

Figure 5:
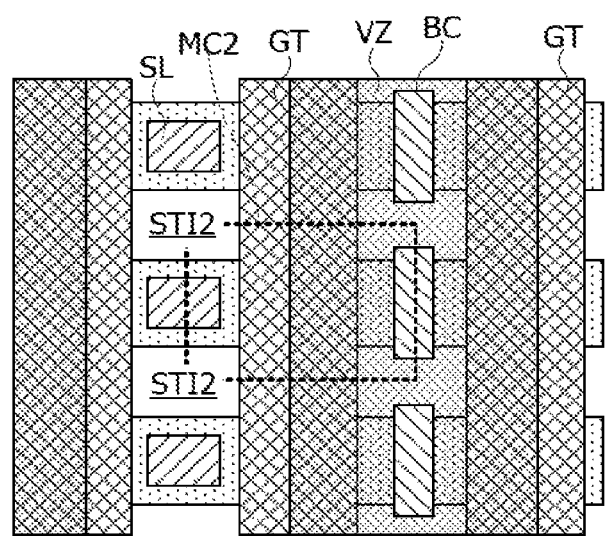
FIG. 5 is a top view of memory cells according to another embodiment.

Thus, FIG. 5 shows memory cells MC2 that differ from the memory cells MC1 in that the trench conductor BC forming the bit line BL is interrupted above trench isolations STI2, so as to form sections separating sections of the active layer AL, the sections of the active layer AL being bounded by two adjacent trench isolations STI2. It will be noted that by making provision for sections BC completely separating two aligned sections of active layer AL between two gates GT, formation of parasitic resistors between the two aligned sections of the active layer AL is prevented.

Figure 6:
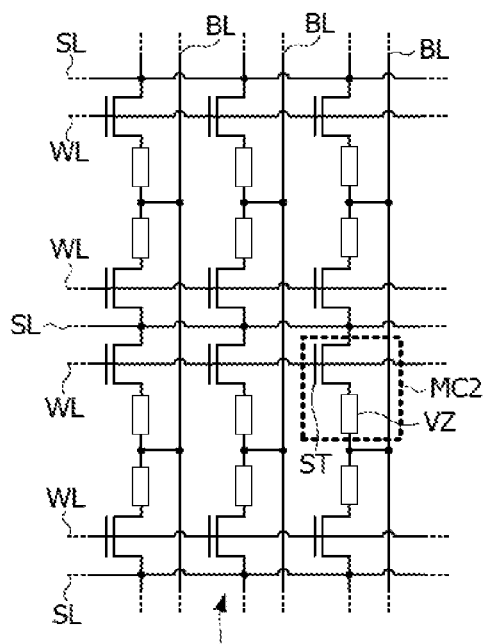
FIG. 6 schematically shows the electric circuit of a memory plane comprising memory cells each containing a variable-resistance element, such as those in FIG. 5.

FIG. 6 is a circuit diagram of a memory plane MA2 comprising a plurality of memory cells, such as the memory cell MC2 in FIG. 5. The memory plane MA2, which is equivalent to the memory plane MA1 (FIG. 4), differs from the latter simply in that the bit lines BL are perpendicular to the word lines WL and to the source lines SL. It will be noted that the structure of the memory cell MC2 may equally well be used in the memory plane MA2 as in the memory plane MA1 (FIG. 4).

Figure 7A:
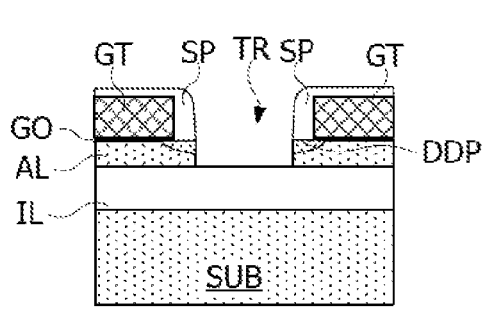
FIGS. 7A to 7E schematically show in transverse cross section a semiconductor substrate at various stages of fabrication of a memory cell such as the cell in FIG. 3A, according to one embodiment.

FIGS. 7A to 7E show a portion of the substrate SUB on which a plurality of memory cells of the memory plane MA1 or MA2 have been formed. FIG. 7A shows the substrate after the gates GT have been produced and spacers SP on the gates GT. In a fabrication step illustrated in FIG. 7A, trenches TR are formed in the active layer AL between the spacers SP formed on the gates GT, the trenches TR being produced so as to reach the insulating layer IL.

Figure 7B:
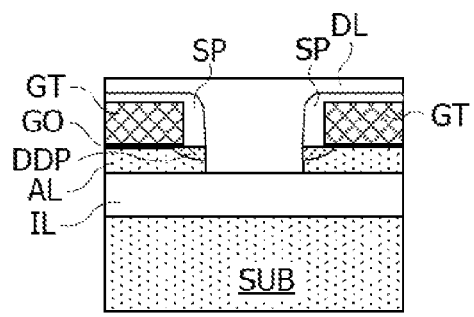

In the following fabrication steps, illustrated by FIG. 7B, the substrate SUB is covered with a dielectric layer DL, including in the trenches TR. The layer DL is for example made of a metal oxide.

Figure 7C:
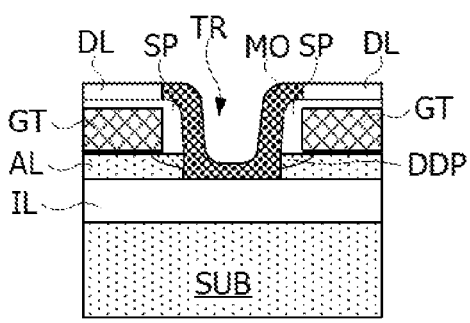

In the following fabrication steps, illustrated by FIG. 7C, the insulating layer DL is etched so as to expose the trenches TR between the spacers SP covering the gates GT. The surface of the substrate and the trenches TR are then covered with a layer MO of substantially uniform thickness of the material intended to form the variable-resistance elements VZ.

Figure 7D:
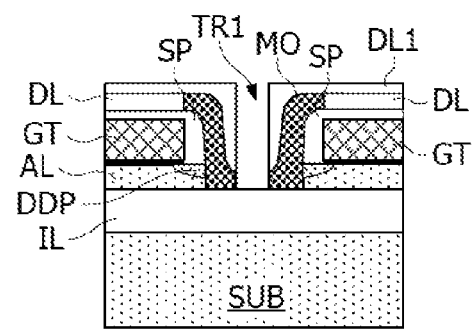

In the following fabrication steps, illustrated by FIG. 7D, the surface of the substrate is covered with a dielectric layer DL1, including in the trenches TR1 covered with the layer MO. The layer DL1 is then etched through a mask so as to form trenches TR2 substantially in the center of the trenches TR, passing through the layer MO and reaching the insulating layer IL.

Figure 7E:
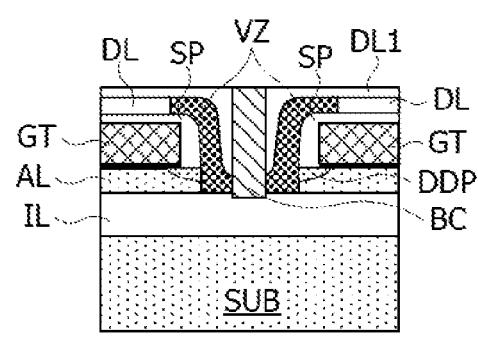

In the following fabrication steps, illustrated by FIG. 7E, the trenches TR2 are filled with a conductor in order to form a trench conductor BC and in order to form the variable-resistance elements VZ in the layer MO, on either side of each trench TR2. For example, the walls and bottom of the trenches TR2 may be covered with a conductive layer, for example made of titanium or titanium nitride, and the trenches TR2 may then be filled with tungsten or copper. The layers DL, DL1 may be made of PMD (polysilicon metal dielectric).

The trench conductors BC may directly form the bit lines BL, as illustrated in FIG. 3C, or indeed be cut into sections as illustrated in FIG. 5.

Figure 8A:
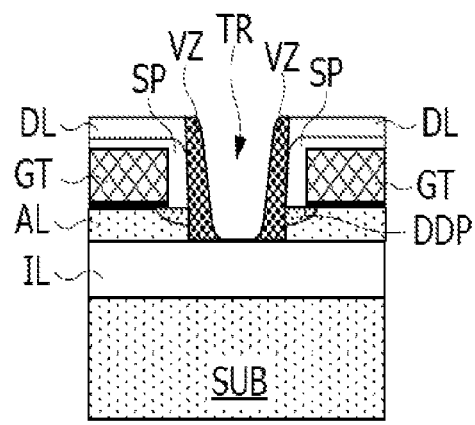
FIGS. 8A and 8B show in transverse cross section a semiconductor substrate at various stages of fabrication of a memory cell, according to another embodiment.
Figure 8B:
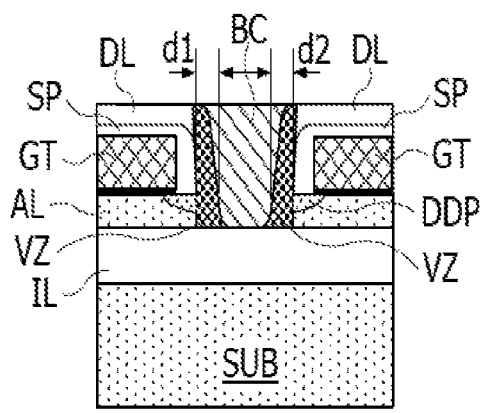

FIGS. 8A and 8B show fabrication steps that may be carried out following the step of etching the dielectric layer DL and of depositing the layer MO (FIG. 7C), according to another embodiment. FIG. 8A illustrates a step of anisotropic etching of the layer MO, carried out until the material of the layer MO at the bottom of the trenches TR is completely removed, and the insulating layer IL is exposed, as was the case when the spacers were formed on the lateral flanks of the trenches TR. This step makes it possible to produce variable-resistance elements VZ on each flank facing each trench TR between two gates GT, and for each section of active layer AL between two adjacent trench isolations STI2.

In the following fabrication steps, illustrated by FIG. 8B, the trenches TR between the variable-resistance elements VZ are filled with a conductor in order to form the trench conductor BC making up a bit line BL. By producing the variable-resistance elements VZ with the spacer-forming technique, the trench conductor BC is self-centered between two adjacent gates GT. Thus, the thicknesses d1, d2 of the variable-resistance elements VZ, between the active layer AL and the trench conductor BC, are substantially identical, and therefore the resistances of the elements VZ are also substantially identical.

The various memory cell embodiments described above may be produced on a fully depleted SOI (FDSOI) substrate, with an active layer AL and an insulating layer IL of thicknesses of about 7 nm and 25 nm, respectively.

It will be clearly apparent to those skilled in the art that various variant embodiments of the present disclosure are possible and that it has various applications. In particular, the disclosure is not limited to a memory, but also encompasses a single memory cell formed in an SOI substrate. In this case in particular, it is not necessary to provide for self-centering of the contact BC in the variable-resistance material, since only a single variable-resistance element will be produced.

It will also be noted that the memory cell may be produced on a conventional semiconductor substrate on which an insulating layer (IL) has been deposited, the semiconductor layer AL being formed on the insulating layer, for example by epitaxy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory cell comprising:
  a selection transistor having a control gate and a first conduction terminal;
  a variable-resistance element connected to the first conduction terminal, the selection transistor and variable-resistance element being formed in a wafer that includes:
    a semiconductor substrate,
    a first insulating layer covering the semiconductor substrate, and
    a semiconductor active layer covering the insulating layer, the control gate being formed on the active layer and having a lateral flank,
  a second insulating layer covering the lateral flank of the control gate,
  a first trench formed through a lateral flank of the active layer, along the lateral flank of the gate, and reaching the first insulating layer, wherein the variable-resistance element includes a layer of variable-resistance material positioned in the first trench along the lateral flank of the active layer, the layer of variable-resistance material covering a portion of a top of the control gate, and
  a trench conductor formed in the first trench and against a lateral flank of the layer of variable-resistance material along the lateral flank of the active layer.

2. The memory cell according to claim 1, comprising adjacent trench isolations, in which the trench conductor is formed between the adjacent trench isolations, the trench isolations and the trench conductor bounding the memory cell.

3. The memory cell according to claim 2, in which the trench conductor passes through the adjacent trench isolations, bounding the memory cell.

4. The memory cell according to claim 3, in which the layer of variable-resistance material covers a portion of the bottom of the first trench, the trench conductor being formed in a second trench formed through the layer of variable-resistance material.

5. The memory cell according to claim 1, in which the substrate, the active layer and the first insulating layer together form an FDSOI substrate.

6. A memory comprising:
  a semiconductor substrate;
  a first insulating layer covering the semiconductor substrate;
  a semiconductor active layer covering the insulating layer;
  a first trench formed through a lateral flank of the active layer and reaching the first insulating layer,
  a plurality of word lines formed on the semiconductor substrate;
  one or more source lines; and
  first and second memory cells, each of the first and second memory cells including:
    a selection transistor having a control gate, a first conduction terminal, and a second conduction terminal; and
    a variable-resistance element connected to the first conduction terminal, the variable-resistance element including a layer of variable-resistance material positioned in the first trench, and
    a trench conductor formed in the first trench and against a lateral flank of the layer of variable-resistance material, the control gates of the first and second memory cells being respectively connected to first and second word lines of the plurality of word lines, and the second conduction terminal of each selection transistor being connected to the one or more source lines, the variable-resistance elements of the first and second memory cells being formed in the first trench and separated from each other by the trench conductor, which is common to both of the first and second memory cells.

7. The memory according to claim 6, in which the trench conductor couples to a bit line.

8. The memory according to claim 6, in which the second conduction terminal of each of the first and second memory cells is shared with another memory cell of the memory.

9. A memory comprising:
  a first memory cell that includes:
    a first selection transistor having a control gate and first and second conduction terminals, the first and second conduction terminals being positioned in a semiconductor layer;
    a first variable-resistance element connected to the first conduction terminal, the first variable-resistance element extending into the semiconductor layer; and
    a first insulating layer extending between a lateral sidewall of the control gate and the first variable-resistance element and between a portion of the top side of the control gate and a top side of the first variable-resistance element, the first insulating layer electrically insulating the control gate from the variable-resistance element; and
  a second memory cell that includes:
    a second selection transistor having a control gate and first and second conduction terminals, the first and second conduction terminals of the second selection transistor being positioned in the semiconductor layer;
    a second variable-resistance element connected to the first conduction terminal of the second selection transistor, the second variable-resistance element extending into the semiconductor layer and being separated from the first variable-resistance element by the trench conductor; and
    a second insulating layer extending between a lateral sidewall of the control gate of the second selection transistor and the second variable-resistance element and between a portion of the top side of the control gate of the second selection transistor and a top side of the second variable-resistance element, the second insulating layer electrically insulating the control gate of the second selection transistor from the second variable-resistance element.

10. The memory according to claim 9, comprising:
a semiconductor substrate, and
a third insulating layer covering the semiconductor substrate and positioned between the semiconductor layer and the semiconductor substrate.

11. The memory according to claim 10, wherein the first variable-resistance element extends completely through the semiconductor layer and contacts the third insulating layer.

12. The memory according to claim 9, wherein the control gate is formed on a top surface of the semiconductor layer, the memory further comprising a fourth insulating layer positioned between the control gate and the top surface of the semiconductor layer.

13. The memory according to claim 9, further comprising:
a trench conductor extending in the semiconductor layer and against a lateral flank of the first variable-resistance element, the first variable-resistance element being positioned between the first insulating layer and the trench conductor.

14. The memory according to claim 9, further comprising:
a source line electrically connected to the second conduction terminals of the first and second memory cells;
a bit line electrically connected to the trench conductor; and
first and second word lines electrically connected to the control gates of the first and second memory cells, respectively.

15. The memory cell according to claim 1, further comprising:
a source line coupled a second conduction terminal of the selection transistor;
a bit line coupled to the trench conductor; and
a word line coupled to the control gate.

16. The memory cell according to claim 1, in which the selection transistor includes a second conduction terminal, the second conduction terminal shared with an adjacent memory cell.

17. The memory according to claim 6, in which the layers of variable-resistance material of the first and second memory cells cover a lateral flank of each respective control gate.

18. The memory according to claim 6, in which the layers of variable-resistance material of the first and second memory cells cover a portion of a top of each respective control gate.

* * * * *